(12) United States Patent  
Merlet et al.

(10) Patent No.: US 7,004,833 B2
(45) Date of Patent: Feb. 28, 2006

(54) SYSTEM FOR VENTILATING AN ELECTRICAL OR ELECTRONIC EQUIPMENT BOX

(75) Inventors: Etienne Merlet, Montigny le Bretonneux (FR); Jean-Eric Besold, Saclay (FR)

(73) Assignee: Sagem SA, Paris (FR)

( * ) Notice: Subject to any disclaimer, the term of this patent is extended or adjusted under 35 U.S.C. 154(b) by 0 days.

(21) Appl. No.: 11/002,189

(22) Filed: Dec. 3, 2004

(65) Prior Publication Data

US 2005/0143001 A1 Jun. 30, 2005

(30) Foreign Application Priority Data

Dec. 23, 2003 (FR) .................................. 03 15316

(51) Int. Cl.
*H05K 5/00* (2006.01)
(52) U.S. Cl. ....................................... 454/184; 312/236
(58) Field of Classification Search ................ 454/184, 454/185; 312/236; 361/695, 696
See application file for complete search history.

(56) References Cited

U.S. PATENT DOCUMENTS

| 5,372,543 | A | | 12/1994 | Steele |
| 5,822,186 | A | | 10/1998 | Bull et al. |
| 5,851,143 | A | * | 12/1998 | Hamid .......................... 454/57 |
| 6,042,474 | A | * | 3/2000 | Harvey et al. ............... 454/184 |
| 6,186,890 | B1 | * | 2/2001 | French et al. ................ 454/184 |
| 6,213,819 | B1 | * | 4/2001 | Fan .............................. 439/894 |
| 6,236,564 | B1 | * | 5/2001 | Fan .............................. 361/695 |
| 6,320,291 | B1 | * | 11/2001 | Lin et al. ....................... 310/91 |
| 2004/0077304 | A1 | | 4/2004 | Pfannenberg |

* cited by examiner

*Primary Examiner*—Derek S. Boles
(74) *Attorney, Agent, or Firm*—Stites & Harbison; Douglas E. Jackson (57) ABSTRACT

A system (1) for ventilating a box designed to receive electrical or electronic equipment, the box having a top wall including a ventilator opening (4), the system comprising a ventilator unit (5) for mounting on said wall (3) of the box in register with the ventilator opening (4), said ventilator unit (5) comprising a screen (7) in the form of a cylindrical wall for extending around said ventilator opening (4), said screen (7) being provided with perforations (8) to allow air to pass towards the ventilator opening (4), said screen (7) being extended, at its end remote from the ventilator opening (4) by a solid bottom wall (9) that extends substantially perpendicularly to the screen (7) and forms a vessel for recovering liquid.

13 Claims, 6 Drawing Sheets

SYSTEM FOR VENTILATING AN ELECTRICAL OR ELECTRONIC EQUIPMENT BOX

The invention relates to extracting air.

More particularly, it relates to a system for ventilating a box that is to have electrical or electronic equipment installed therein.

The problems associated with boxes of this type have been brought to the attention of the inventors in the field of aviation.

Such boxes are commonly found in aircraft, where they house electronic control circuits for which it is essential to guarantee effective ventilation. Such boxes are also to be found in certain land vehicles, in particular military vehicles.

Such boxes generally comprise an enclosure having the electronic circuits placed therein and presenting a bottom wall and a top wall that are both perforated so as to form respectively an air inlet and an air outlet which together with a fan placed beneath the box, serve to allow a permanent flow of air to be established within the enclosure to cool the circuits in operation.

Such boxes are generally stowed in zones where maintenance technicians pass, and such technicians often handle liquids (beverages, solvents, fuel, hydraulic fluid, etc.) and it is necessary to avoid such liquids spilling onto the equipment.

Unfortunately, existing boxes are not at all designed to keep out liquids. In the event of a liquid being accidentally spilt, the perforations in the top wall allow the liquid to flow freely over the equipment housed inside the box, and it is then necessary at best to clean the equipment, and at worse to replace it.

The invention seeks in particular to solve the above-mentioned drawbacks by proposing a system for ventilating a box that is to receive electrical or electronic equipment, the system presenting improved ability to withstand liquid spills.

To this end, the invention provides a ventilation system for a box for receiving electrical or electronic equipment, said box having a top wall provided with a ventilator opening, the system comprising a ventilator unit for securing to said wall of the box in register with the ventilator opening, said ventilator unit comprising a screen in the form of a side wall for placing around said ventilator opening, said screen being provided with perforations to allow air to pass towards the ventilator opening, said screen being extended at its side remote from the ventilator opening by a solid bottom wall extending substantially perpendicularly to the screen and forming a vessel for recovering liquid.

Thus, air can flow freely through the screen while the bottom wall forms an obstacle to liquid penetrating into the box. This provides the equipment in the box with better protection against liquid spills.

In an embodiment, the bottom wall is concave, its concave side facing towards the screen, this provides an increased retention capacity for the reservoir formed by the bottom wall.

Preferably, the bottom wall and the screen form a one-piece unit.

Moreover, the ventilation system may include control means for controlling the flow rate of air passing through said ventilator unit.

By way of example, the screen is in the form of a substantially cylindrical wall, while said control means comprise a peripheral ring provided with at least one tongue that co-operates with the screen, the ring being mounted to turn relative to the screen between an "open" position in which said tongue overlies at least in part a portion of the screen that has no perforations so as to allow air to pass freely through the screen, and a "closed" position in which the tongue overlies at least in part a perforated portion of the screen to shut off at least a fraction of the passage for air through the screen.

Preferably, the ring has a plurality of tongues uniformly distributed around its circumference.

Thus, by turning the ring, it is possible to adjust accurately the flow rate of air passing through the ventilation unit.

Moreover, the ventilation unit may be secured to the box via the screen, and for this purpose the screen may be provided with fixing tabs for fixing to the wall of the box.

In addition, the ventilator unit may include a deflector suitable for being interposed between the screen and the wall of the box, the deflector comprising a substantially frusto-conical deflector wall, which may extend towards the bottom wall. The deflector serves to avoid slanting splashes of liquid reaching the inside of the box by passing through the screen. In order to further reduce the risk of liquid penetrating into the box, the deflector may present a solid central mask with an annular opening being defined between the deflector wall and said mask to allow air to pass freely while further limiting any risk of liquid penetrating into the box, even if the liquid arrives at a high angle of incidence.

In an embodiment, the mask is connected to the deflector wall by radial bridges, and the deflector may include fixing tabs for fixing to the wall of the box.

The above-described ventilation system may also comprise a fan for fixing to the wall of the box in register with the ventilation opening, on the other side of the wall relative to the ventilation unit, so as to establish forced movement of air and further improve the cooling capacity of the ventilation system.

The invention also provides apparatus for cooling electrical or electronic equipment, the apparatus comprising a box for receiving said equipment, said box presenting a top wall having a ventilator opening formed therein, and a ventilation system as described above, secured to the box in register with said ventilator opening.

Other objects and advantages of the invention appear in the light of the following description given with reference to the accompanying drawings, in which.

The figures show a ventilation system 1 for a box 2 that is to house electrical or electronic equipment, which may be constituted by a plurality of cards carrying integrated circuits, e.g. for providing automatic pilot control of an airplane or a helicopter.

Figure 4:
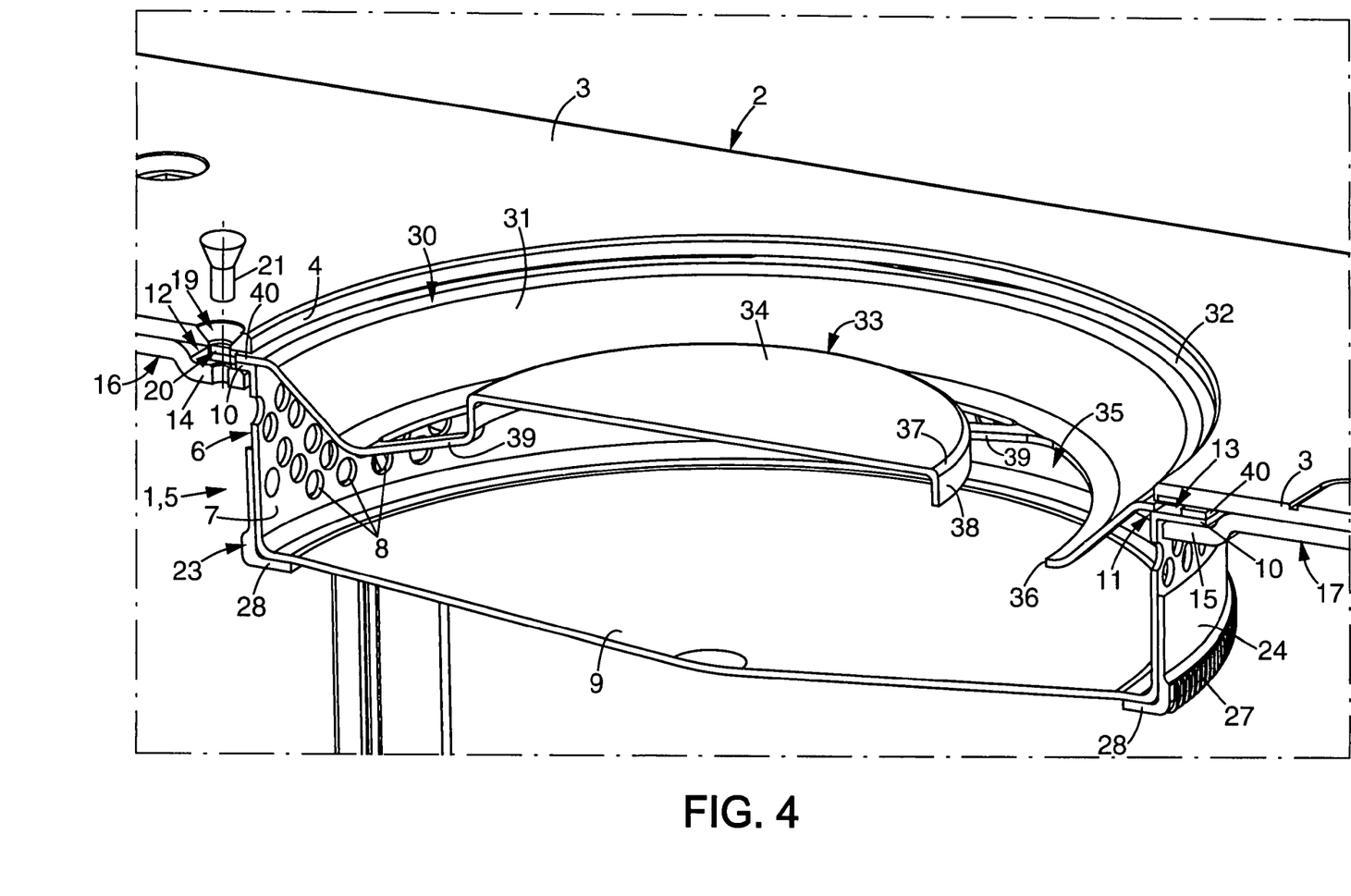
FIG. 4 is a perspective view in section showing a ventilation system mounted on the top wall of a box for containing electrical or electronic equipment.

The box 2, shown in part in FIG. 4, has a top wall 3 provided with a ventilator opening 4, which in this case is circular in outline, it being understood that any other outline (rectangular, square, oval, etc.) could be envisaged.

Although not shown in the drawings, it must be understood that such a box 2 is provided in another wall (e.g. in a bottom wall opposite from the top wall 3), with an inlet (not shown) through which air, possibly driven by a fan disposed close to said air inlet, penetrates into the box so as to subsequently to be exhausted through the ventilator opening 4.

Thus, a cooling air circuit is established in the box 2 which runs from the air inlet to the ventilator opening 4 and serves to cool the equipment, which has a tendency to heat up when in operation.

As shown in FIG. 4, the ventilation system 1 comprises a ventilator unit 5 for mounting directly on the wall 3 over the ventilator opening 4.

The ventilator unit 5 comprises a part 6 in the form of a basket or strainer (which is the term used in the description below), for allowing air to pass through while serving to recover any liquid that might flow through the ventilator opening 4 towards the inside of the box 2.

The strainer 6 comprises a side—or peripheral—wall 7 that surrounds said opening when the ventilator unit 5 is secured to the top wall 3 of the box 2 in register with the ventilator opening 4, surrounds said opening.

Figure 2:
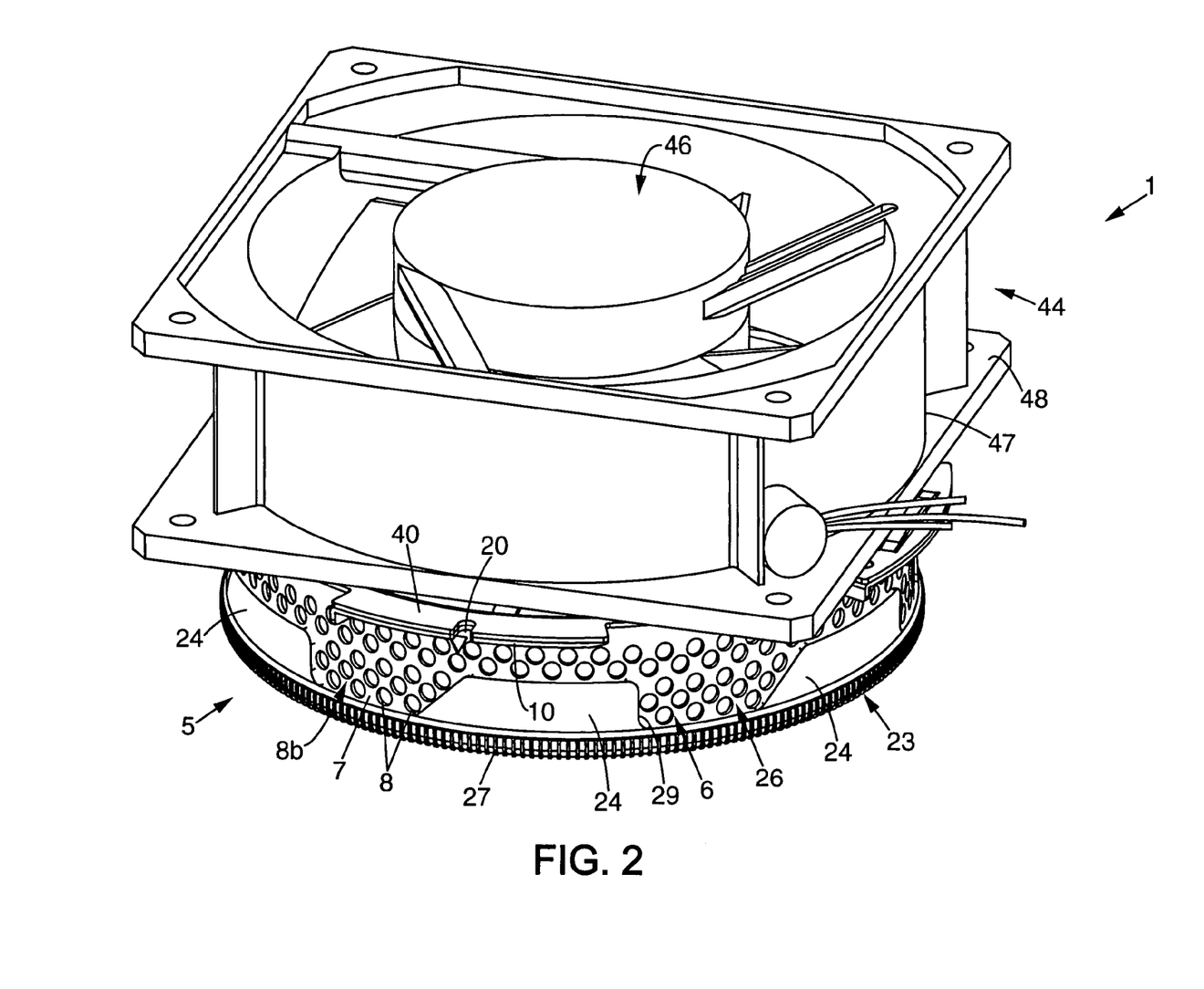
FIG. 2 is a perspective view of the FIG. 1 ventilation system shown assembled.
Figure 3:
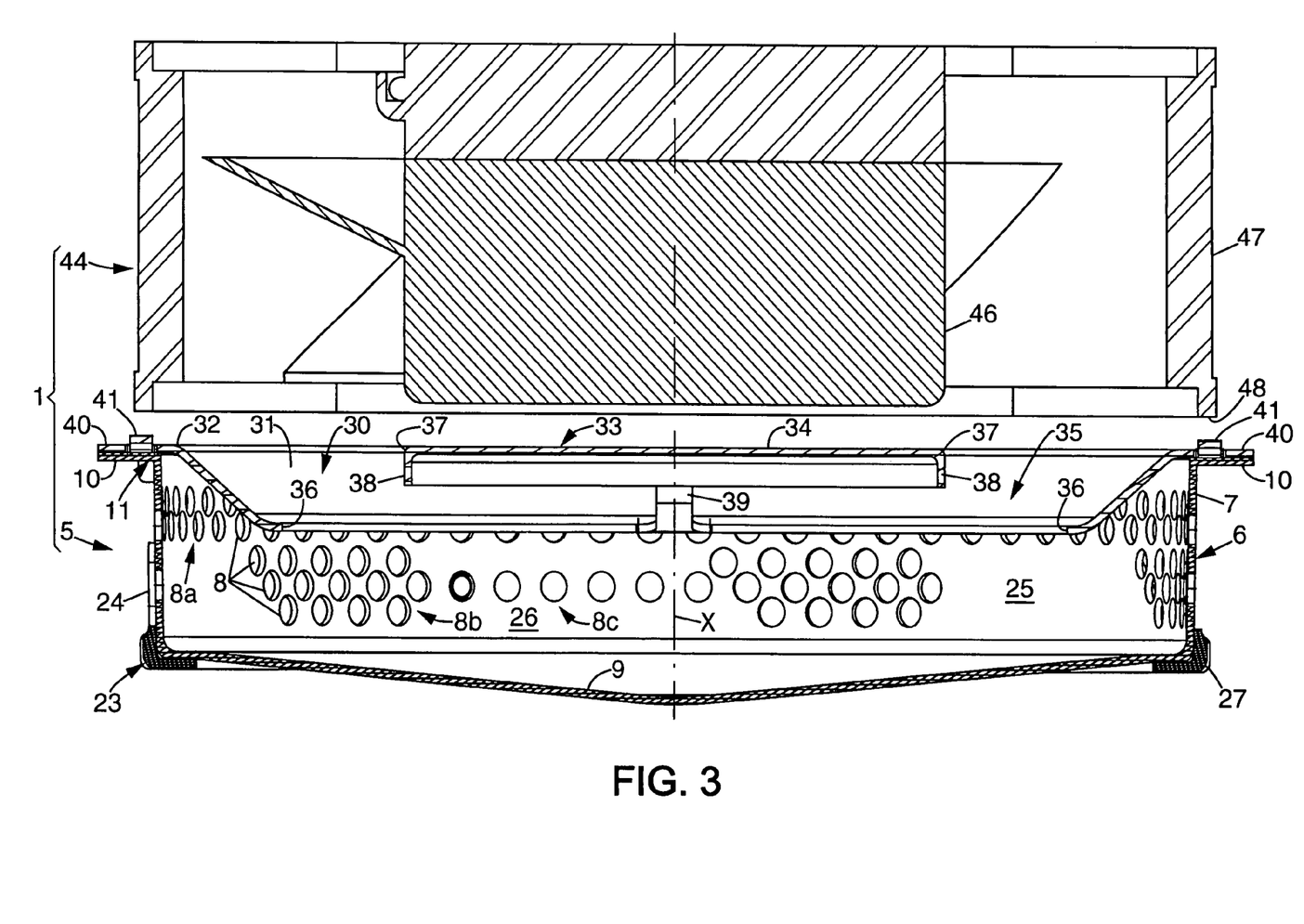
FIG. 3 is an elevation view in section of the FIG. 2 ventilation system.

As can be seen in particular in FIG. 2, the peripheral wall 7 of the strainer 6 presents a multitude of perforations 8 distributed around its circumference, such that the wall 7 forms a ventilation screen allowing air to pass freely from the inside of the box 2 to the ventilation opening 4 (or vice versa).

As can be seen in particular in FIG. 4, the strainer 6 also comprises a bottom wall 9 that is solid (i.e. that does not have any holes), which wall is integral with the screen 7 and extends it remote from the ventilation opening 4 in register therewith and at a distance therefrom, so that in section the strainer 6 is substantially U-shaped.

In the example shown in the figures, the ventilation opening 4 is circular in outline, so the strainer 6 is circularly symmetrical about an axis X which, when the ventilator unit 5 is mounted on the wall 3 of the box 2 coincides substantially with the center of the opening.

In the example described with reference to the accompanying figures, the strainer 6 is a single part, however the screen 7 and the bottom wall 9 could comprise two separate parts that are assembled together, without the abilities of the strainer 6 being altered thereby.

Furthermore, in a preferred embodiment, the strainer 6 is made of a molded plastics material, which presents an advantage in terms of cost and ease of implementation, but it could equally well be made of a metal, e.g. of aluminum.

Assuming that it is desired to obtain electromagnetic protection for the electrical or electronic equipment contained in the box 1, it would be preferable for the strainer 6 to be made of metal or for at least a portion of it to be made conductive, e.g. by metal plating at least one of its faces, or by integrating a conductive filler in the molded material, or by any other method known to the person skilled in the art.

Figure 1:
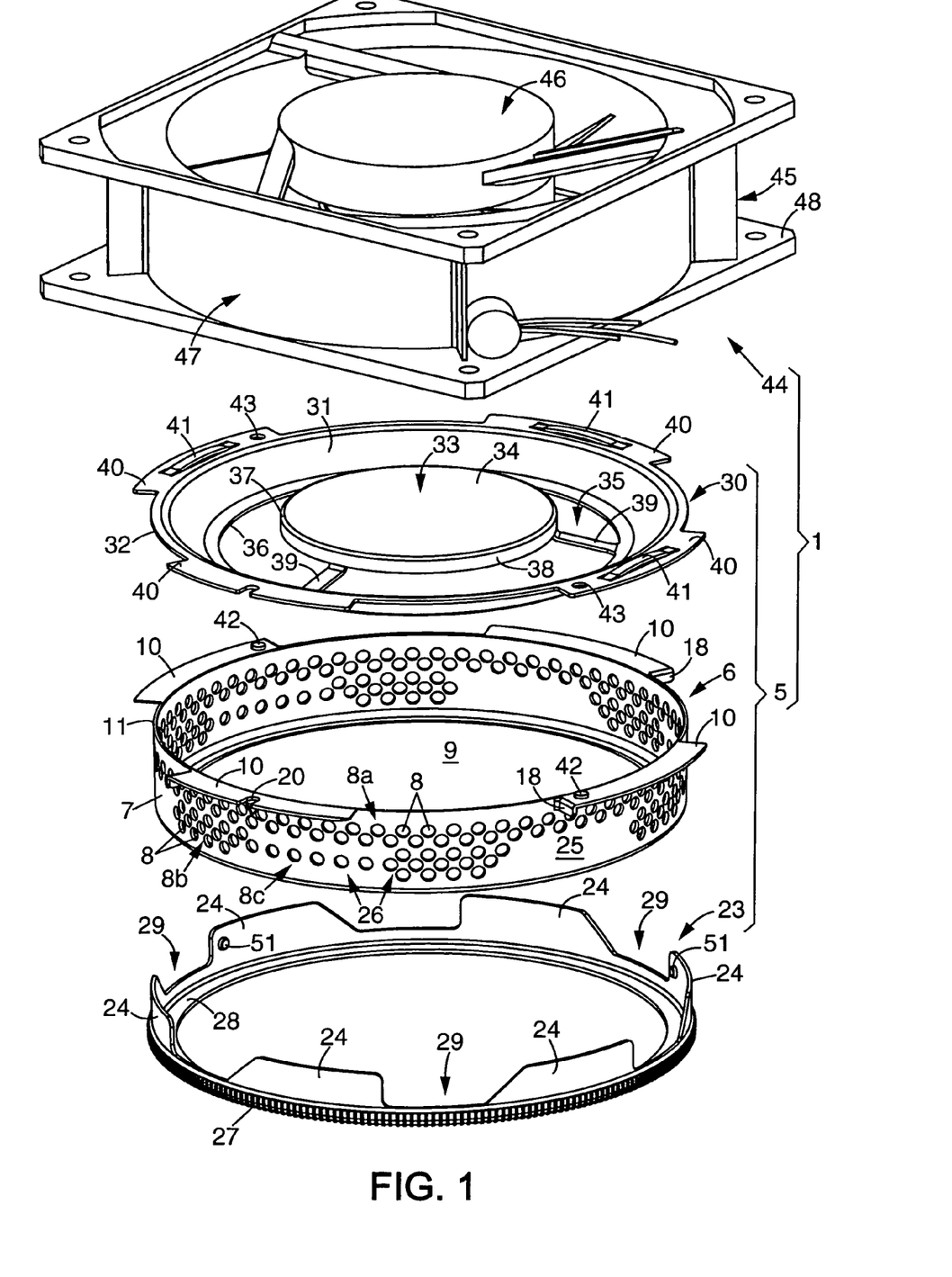
FIG. 1 is an exploded perspective view of a ventilation system in accordance with the invention.

As can be seen in FIG. 1, the strainer 6 is provided with fixing tabs 10 that extend radially outwards from the screen 7, starting from a top edge 11 thereof remote from the bottom wall 9.

The tabs 10 are for sliding in complementary slots 12, 13 that are formed between the wall 3 of the box 2 and hooks 14, 15, themselves formed by angled plates 16, 17 fixed to the wall 3 of the box 2 in the vicinity of the ventilation opening 4.

The strainer 6 is thus installed in two stages: firstly the strainer 6 is pressed against the wall 3 of the box 2 from inside the box, and secondly the strainer 6 is turned about its axis X in order to slide the fixing tabs 10 into the slots 12, 13.

As can be seen in FIG. 1, the fixing tabs 10 of the strainer 6 are provided with right-angled lips 18 forming abutments that come to press against the edges of the plates 16, 17, thereby limiting the pivoting stroke of the strainer 6, and thus ensuring that it is properly positioned relative to the wall 3 and relative to the opening 4.

Once the strainer 6 is properly in place, it is suspended from the wall 3 by the hooks 14, 15. In order to avoid any unwanted separation of the strainer 6, provision can be made for it to be held relative to the wall 3 by pins. Thus, in the embodiment shown in FIG. 4, the wall 3 is pierced in the vicinity of the ventilation opening 4 by a hole 19, and when the strainer 6 is properly positioned, the hole opens out in register with a notch 20 formed in one of the fixing tabs 10. Inserting a pin 21 through both the hole 19 and the corresponding notch 20 serves to prevent the strainer 6 from turning relative to the wall 3 of the box 2.

The bottom wall 9 forms a vessel for recovering and retaining any liquid that might flow through the ventilation opening 4 towards the inside of the box 2. It will readily be understood that the volume capacity of the retention vessel formed in this way depends on the distance between the bottom wall 9 and the perforations 8 in the screen 7 that are closest to the bottom wall 9.

Figure 5:
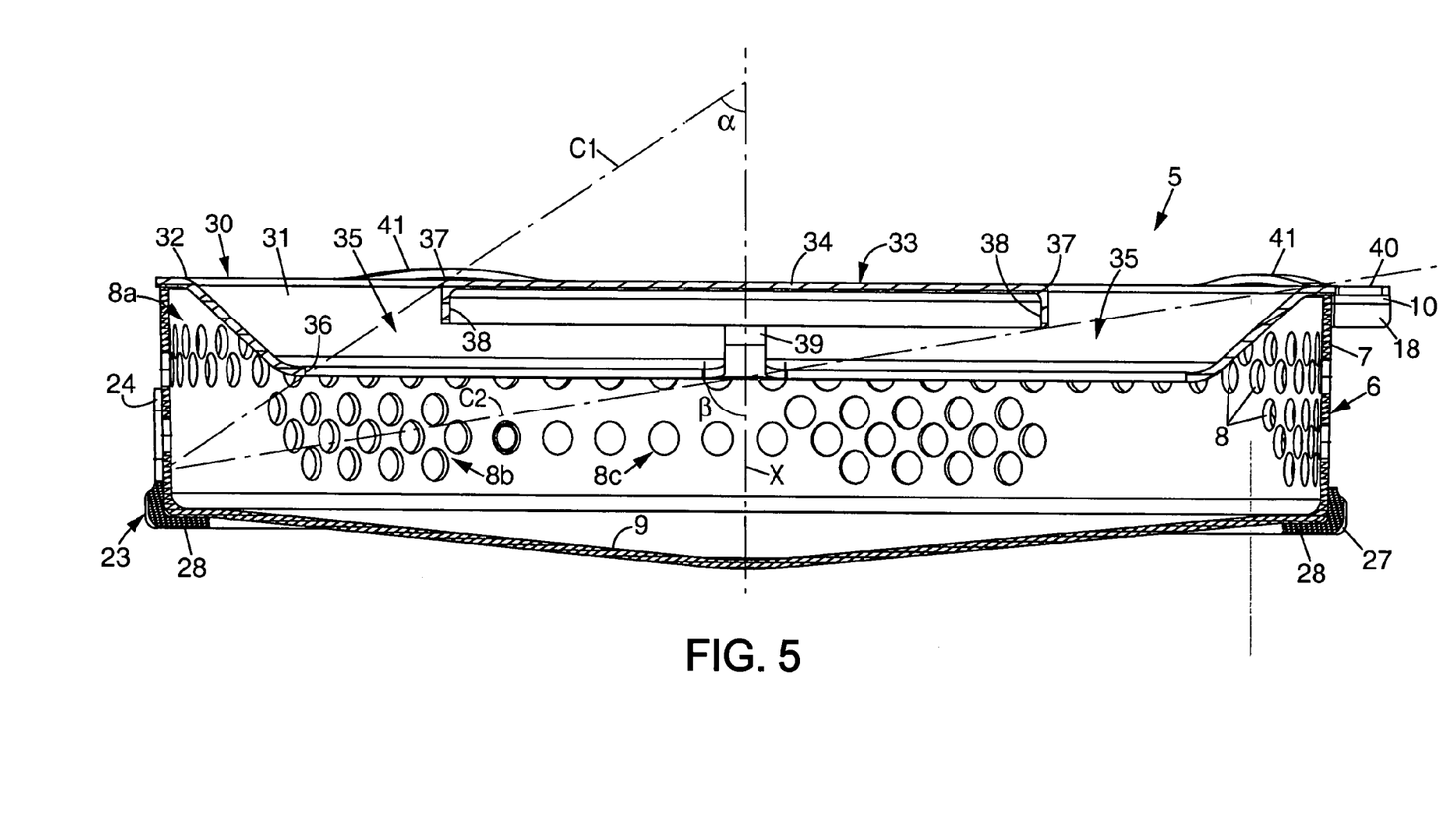
FIG. 5 is an elevation view in section showing a ventilation unit for a ventilation system in accordance with the invention.

In order to guarantee that the retention vessel as formed in this way has sufficient volume capacity but without it being necessary to concentrate all of the perforations 8 in the top portion of the screen 7, the bottom wall 9 can be shaped to be downwardly dished, as shown in FIG. 5. The bottom wall 9 is thus concave with its concave side facing towards the screen 7.

In addition, the inventors have found it appropriate to fit the ventilation unit 5 with means for controlling the flow rate of the air passing therethrough.

Thus, in the embodiment as shown in particular in FIG. 2, the control means comprise a peripheral ring 23 and at least one tongue 24 (in practice, and as shown in FIG. 1, the ring 23 has a plurality of tongues 24, six in this case, uniformly distributed around its circumference), which are pressed against the outside of the screen 7.

This ring 23 is mounted to turn relative to the screen 7 about the axis X between an "open" position in which the tongue 24 overlies at least in part a portion 25 of the screen 7 that does not have any perforations, so as to allow air to pass freely through the screen 7, and a "closed" position in which said tongue 24 overlies at least in part a perforated portion 26 of the screen 7 so as to obstruct, at least in part, the flow of air through the screen. As can be seen in FIGS. 1 and 2, the ring 23 has an annular peripheral edge 27 which makes it easier to grasp by a technician setting out to change the air flow rate allowed by the ventilation unit 5 by turning the ring 23 relative to the screen 7.

As is clearly shown in FIGS. 4 and 5, the ring 23 presents a collar 28 that comes to bear against the bottom wall when the ring 23 is mounted on the strainer 6 at the junction between the screen 7 and the bottom wall 9.

The inventors have set out to achieve effective control over the air flow rate that is allowed by the ventilator unit 5.

Figure 6A:
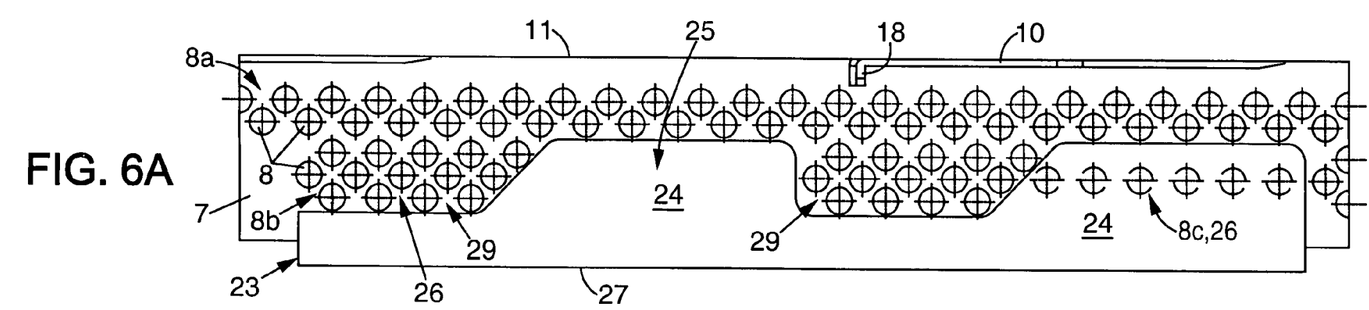
FIGS. 6A, 6B, and 6C are developed plan views showing the screen of a ventilation unit for a ventilation system in accordance with the invention, showing different positions for the air flow rate control ring relative to the screen, so as to enable the flow rate of the cooling air to be controlled.
Figure 6B:
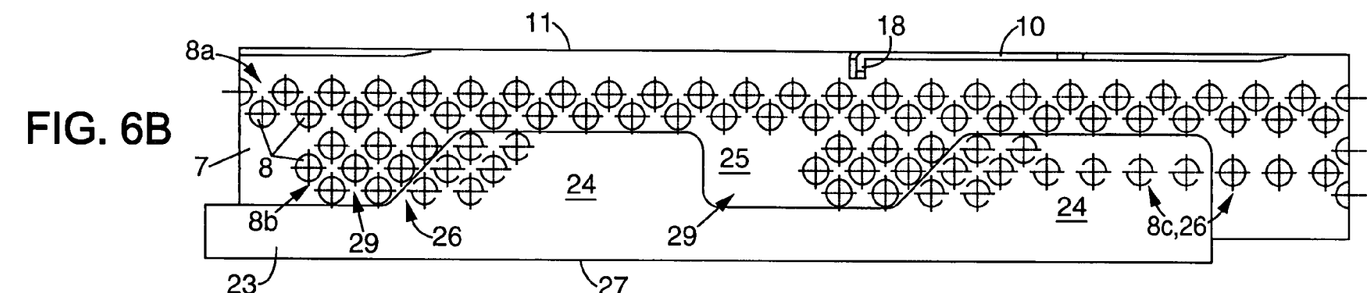
Figure 6C:
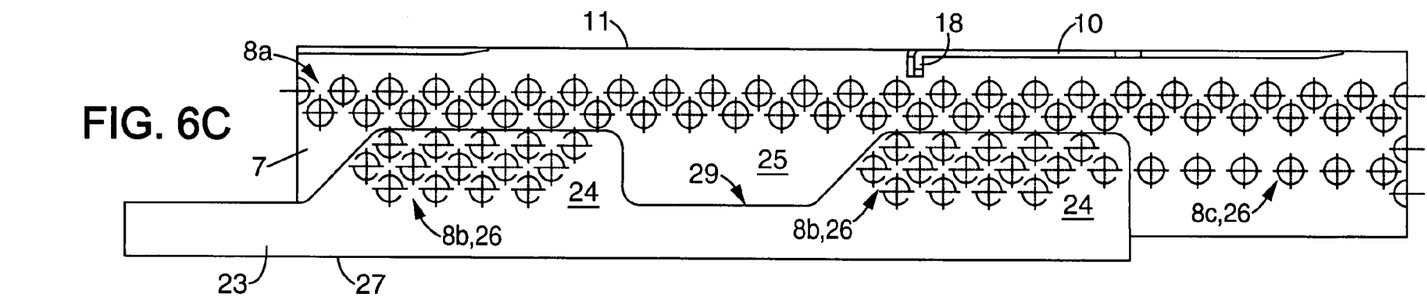

As can be seen in FIGS. 6A to 6C, which show a strainer of the screen 7 and of the ring 23 both developed flat, the screen 7 is provided with a main row of perforations 8a extending in the vicinity of the top edge 11 and parallel thereto, and also beside said row 8a and away from said edge 11, bunches of perforations 8b that are regularly spread out around the circumference of the screen 7.

Between some of these bunches 8b, there are provided the portions 25 that do not have perforations, whereas between other bunches 8b there are provided secondary rows 8c of perforations.

The ring 23 is shown in FIG. 6A in its open position. In this position, one of the tongues 24 overlies a portion 25 that has no perforations, while the adjacent tongue 24 overlies a secondary row 8c of perforations, with the bunches 8b being in register with notches 29 formed in the ring 23 between the tongues 24.

This open position of the ring 23 guarantees an air flow rate that corresponds to the maximum capacity of the ventilator unit 5.

In FIG. 6C, the ring 23 is shown in its closed position. In this position, each tongue 24 overlies a bunch 8b of perforations, with the air flow rate then corresponding to the minimum rate allowed by the ventilator unit 5.

An intermediate position between the open position and the closed position of the ring 23 is shown in FIG. 6B. In this position, one of the tongues 24 overlies both a bunch 8b of perforations and a portion 25 having no perforations, while the adjacent tongue 24 overlies a bunch 8b and a secondary row 8c of perforations 8.

It will be understood that in this position, the air flow rate allowed by the ventilator unit 5 is intermediate between its minimum value and its maximum value.

In an embodiment shown in particular in FIGS. 4 and 5, the ventilator unit 5 further includes a deflector 30 interposed between the strainer 6—more precisely the screen 7—and the wall 3 of the box 2, which deflector has a circular frustoconical deflecting peripheral wall 31 centered on an axis coinciding with the axis X of the strainer 6 when the two parts 6 and 30 are assembled together, said wall 31 extending from a circular outer edge 32 of the deflector 30 towards the axis of symmetry thereof and towards the bottom wall 9 of the strainer 6.

This deflector wall 31 protects the screen 7 against possible obliquely-directed drops of liquid coming from outside the box 2.

This wall 31 which is curved towards the bottom wall 9 also forms a chute guiding the flow of a liquid that reaches the ventilator opening 4 towards the bottom wall 9.

In order to further reduce the risk of liquid reaching the screen 7, the deflector 30 preferably has a central mark 33 comprising a solid membrane 34, i.e. a membrane having no perforations, of circular outline coaxial with the deflector wall 31. The mask 33 and the deflector wall 31 thus define between them an annular opening 35 for allowing air to pass from the inside of the box 2 towards the ventilation opening 4.

The half-angle at the apex $\alpha$ of the virtual cone C1 defined by a generator line extending from the inside edge 36 of the deflector wall 31 and the outside edge 37 of the mask 33 defines the maximum angle of incidence along which a liquid drop traveling obliquely and centrifugally (away from the axis X) can reach the strainer 6. By appropriately selecting the respective dimensions for the mask 33 and the deflector wall 31, the person skilled in the art can ensure that this cone C1 does not intersect the screen 7, or at least intersects it only below the perforations 8.

In addition, in order to further limit any risk of obliquely-directed drops reaching the screen 7, the mask 33 may be provided with an annular rim 38 extending perpendicularly to the membrane 34 towards the bottom wall 9.

The half-angle at the apex $\beta$ of the vertical cone C2 defined by a generator line joining the outside edge 32 of the deflector 30 to the end of the rim 38 defines the maximum angle of incidence along which a liquid drop traveling obliquely and centripetally (i.e. towards the axis X) can reach the inside of the strainer 6.

As above, the person skilled in the art can select dimensions respectively for the deflector wall 31, and for the mask 33—and in particular the height of its rim 38—so as to ensure that the cone C2 does not intersect the screen 7, or at worst intersects it only below the perforations 8.

As can be seen in FIG. 1, the mask 33 is connected to the deflector wall 31 by linking bridges 39 which extend radially and which support the mask 33.

As also shown in FIG. 1, like the strainer 6, the deflector 30 has fixing tabs 40 which extend radially from its outside edge 32. These tabs 40 overlie the tabs 10 of the strainer 6 and are inserted together therewith in the slots 12, 13.

In order to ensure that the ventilator unit 5 is held securely relative to the wall 3 of the box 2, at least some of the tabs 40 of the deflector 30 (three in the example shown) are provided with spring blades 41 that press against the wall 3 and urge both the deflector 30 and the strainer 6 towards the hooks 14, 15.

Furthermore, in order to ensure that the deflector 30 is properly positioned relative to the strainer 6, at least two of the tabs 10 of the strainer are provided with projecting positioning pegs 42 that are received in holes 43 formed in register therewith in two corresponding tabs 40 of the deflector 30.

In an embodiment shown in FIGS. 1 and 2, the ventilation system 1 may further comprise a fan 44 designed to be fixed to the wall 3 of the box 2 in register with the ventilation opening 4, on the side of the wall 3 that is opposite from the side on which the ventilator unit 5 is located.

The fan 44 comprises a box 45 in which a propeller or an impeller 46 (depending on whether the fan is an axial fan or a centrifugal fan) is mounted to rotate about an axis that is stationary relative to the box 45, said axis coinciding with the axis of symmetry X of the strainer 6 when the entire system 1 is in position on the box 2.

The box 45 of the fan 44 has a cylindrical wall 47 with a bottom end that is shaped to form a bottom plate 48 whereby the fan 44 is secured to the wall 3 of the box 2.

The fan 44 is designed to exhaust air either laterally, in which case it is a centrifugal fan, or else through the top of the fan, in which case it is an axial fan (as shown in FIGS. 1 and 2).

It should be observed that the screen 7 provides an internal cavity in which the air flows prior to reaching the fan 44 so there is no need, unlike prior art systems, to provide additional space between the top wall 3 of the box 2 and the fan 44, so the fan can be mounted directly on the wall 3. This achieves a substantial space saving.

Moreover, it should be observed that the mask 33 overlies the central portion of the fan 44, and as a result it does not provide any obstruction to the fan 44 sucking air coming from inside the box 2. Thus, providing protection against drops of liquid traveling obliquely is not to the detriment of air flow.

The ventilation system 1 as described above is assembled as follows.

The various components of the ventilator unit 5 are assembled together by mounting the ring 23 and the deflector 30 on the strainer 6.

As can be seen in FIG. 1, some of the tongues 24 of the ring 23 carry pegs 51 suitable for being received in perforations 8c in the portions 25 of the screen 7, thus firstly supporting the ring 23 and secondly holding it in a given angular position relative to the strainer 6, with this position being selected by the technician.

The tongues 24 also present a certain amount of flexibility, thus making it possible firstly to assemble the ring 23 on the strainer 6 by snap-fastening, and secondly to allow the pegs 51 to be forced out of the perforations 8 in which they are located in the event of the ring 23 being turned in order to position the ring 23 at a different angle.

The deflector 30 is engaged on the strainer 6 by positioning their respective fixing tabs 10, 40 in register with one another, as shown in FIG. 1. On this topic, it should be observed that the positioning pegs 42 fitted to the strainer 6, and their respective holes 43 provided in the deflector 30 constitute keying means that make it impossible to mount the deflector 30 upside-down on the strainer 6.

The invention claimed is:

1. A ventilation system for a box for receiving electrical or electronic equipment, said box having a top wall provided with a ventilator opening, the
    system being characterized in that it comprises a ventilator unit for securing to said wall of the box in register with the ventilator opening, said ventilator unit comprising a screen in the form of a side wall for placing around said ventilator opening
    said screen being provided with perforations to allow air to pass towards the ventilator opening, said screen being extended at its side remote from the ventilator opening by a solid bottom wall extending substantially perpendicularly to the screen
    and forming a vessel for recovering liquid.

2. A ventilation system according to claim 1, in which the bottom wall is concave, its concave side facing towards the screen.

3. A ventilation system according to claim 1, in which the bottom wall and the screen form a one-piece unit.

4. A ventilation system according to claim 1, including control means for controlling the flow rate of air passing through said ventilator unit.

5. A ventilation system according to claim 4, in which said screen is in the form of a substantially cylindrical wall, and in which said control means comprise a peripheral ring provided with at least one tongue that co-operates with the screen, the ring being mounted to turn relative to the screen between an "open" position in which said tongue overlies at least in part a portion of the screen that has no perforations so as to allow air to pass freely through the screen, and a "closed" position in which the tongue overlies at least in part a perforated portion of the screen to shut off at least a fraction of the passage for air through the screen.

6. A ventilation system according to claim 5, in which the ring has a plurality of tongues uniformly distributed around its circumference.

7. A ventilation system according to claim 1, in which said screen is provided with fixing tabs for fixing to the wall of the box.

8. A ventilation system according to claim 1, in which the ventilator unit includes a deflector suitable for being interposed between the screen and the wall of the box, the deflector comprising a substantially frustoconical deflector wall.

9. A ventilation system according to claim 8, in which the deflector presents a solid central mask, and in which an annular opening is defined between the deflector wall and said mask to allow air to pass towards the ventilator opening.

10. A ventilation system according to claim 9, in which the mask is connected to the deflector wall by radial bridges.

11. A ventilation system according to claim 8, in which the deflector has fixing tabs for fixing to the wall of the box.

12. A ventilation system according to claim 1, further comprising a fan for fixing to the wall of the box in register with the ventilator opening, on the side of the wall that is opposite from the side where the ventilator unit is located.

13. Apparatus for cooling electrical or electronic equipment, the apparatus comprising a box for receiving said equipment, said box representing a top wall having a ventilator opening formed therein, said apparatus further comprising a ventilation system according to claim 1, secured to the box in register with said ventilator opening.

* * * * *